United States Patent
Sun et al.

(10) Patent No.: US 10,651,958 B1
(45) Date of Patent: May 12, 2020

(54) BI-DIRECTIONAL COUPLER WITH TERMINATION POINT FOR A TEST POINT

(71) Applicant: ARRIS Enterprises LLC, Suwanee, GA (US)

(72) Inventors: Zhijian Sun, Avon, CT (US); Eric J. Cormier, Bristol, CT (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 16/163,552

(22) Filed: Oct. 17, 2018

(51) Int. Cl.
| | |
|---|---|
| *H04B 14/06* | (2006.01) |
| *H04B 17/30* | (2015.01) |
| *G01V 8/12* | (2006.01) |
| *H01P 1/26* | (2006.01) |
| *H01P 5/18* | (2006.01) |
| *G01R 1/067* | (2006.01) |

(52) U.S. Cl.
CPC ......... *H04B 17/30* (2015.01); *G01R 1/06794* (2013.01); *G01V 8/12* (2013.01); *H01P 1/26* (2013.01); *H01P 5/18* (2013.01)

(58) Field of Classification Search
CPC ................ H04B 14/068; H04B 14/046; H04B 10/25751; H04B 10/0793; H04Q 11/0071; H04Q 2011/00039; H04Q 2011/0015
USPC ............................................. 375/244; 398/45
See application file for complete search history.

(56) References Cited

U.S. PATENT DOCUMENTS

| | | | |
|---|---|---|---|
| 2002/0080439 A1* | 6/2002 | Stoneback | A61K 41/0061 398/33 |
| 2017/0099100 A1* | 4/2017 | Bush | H04B 10/25751 |
| 2017/0324392 A1 | 11/2017 | Srirattana | |
| 2018/0124706 A1 | 5/2018 | Mini et al. | |
| 2019/0109637 A9* | 4/2019 | Williams | H04B 10/0775 |
| 2019/0195927 A1* | 6/2019 | Saedi | G01R 27/32 |

OTHER PUBLICATIONS

PCT International Search Report and Written Opinion of the International Searching Authority Re: Application No. PCT/US2019/056729, dated Dec. 17, 2019.

* cited by examiner

*Primary Examiner* — Khai Tran
(74) *Attorney, Agent, or Firm* — Chernoff, Vilhauer, McClung & Stenzel, LLP

(57) ABSTRACT

In one embodiment, an apparatus includes a bi-directional coupler for coupling an upstream signal and a downstream signal to a termination load. A test point detection mechanism is configured to detect when a test point device is inserted in a test point connector. The test point device is configured to perform a test of the upstream signal or the downstream signal. A switch is configured to switch from being coupled to the termination load to being coupled to the test point device when the test point device is detected as being inserted in the test point connector. The switch is configured to switch from being coupled to being coupled to the test point device to the termination load when the test point device is detected as being removed from being inserted in the test point connector.

20 Claims, 9 Drawing Sheets

BI-DIRECTIONAL COUPLER WITH TERMINATION POINT FOR A TEST POINT

BACKGROUND

A test point may be used to measure the performance of an upstream or downstream connection in a network. In one implementation, two separate directional couplers are used to connect two test points (TPs) to measure an upstream and a downstream signal. One directional coupler for a first test point is used for the downstream direction and a second directional coupler for a second test point is used for the upstream connection. This leaves an isolating port that is terminated by a termination load, such as a 75-ohm termination load if the test point also has a load of 75-ohms. The coupler directivity is limited by how good the isolating port is terminated and this achieves maximum directivity performance because the load of the isolating port is the same as the load of the test point.

In a full duplex node design, the use of two separate couplers may add too much of a loss at an output of a power amplifier connected to the coupler. With use of two separate couplers, the insertion loss will be doubled, from 1 dB in single coupler case to 2 dB in two coupler case. The output RF amplifier may already be running very close to its clipping point. With the use of a single coupler, the RF amplifier will not need to provide as much amplification compared to the two coupler case, which will improve the system level modulation error ration or bit error ratio (MER/BER) performance. Accordingly, a single bi-directional coupler may have to be used for both the upstream direction and the downstream direction. One advantage of using a bi-directional coupler is there is a lower insertion loss in the connection because only one coupler is used in both the upstream and the downstream directions. However, isolation between the upstream connection and the downstream connection may be an issue. The directivity of a coupler is defined as the power difference at any given coupling port when the same amount of power is injected into either the downstream direction or the upstream direction. A coupler may have around 25-30 decibels (dB) directivity, which means there may be 25-30 dB isolation between the upstream direction and the downstream direction at any given coupling port. However, this is based on an ideal 75-ohm termination at the isolating port. In a bi-directional coupler, the termination at the isolating port is typically not the perfect 75-ohm termination and thus will limit the isolation between the downstream and the upstream to the return loss of the isolating port. For example, the ideal isolation may not be achieved because one or both of the upstream test point and the downstream test point may not be connected to the bi-directional coupler. For example, a user may only be using one of the test points to test network traffic in one direction. This leaves an open test point port. In the full duplex node design, a 20 dB test point is required and a 10 dB coupler is used. The best return loss from the open test point port is 20 dB, which would limit the coupler directivity at 20 dB even when the coupler has 30 dB directivity by design when all ports are properly terminated. In the worst case, when two reflections are added in phase from two open test point ports, the total isolation between the downstream connection and the upstream connection could be as low as 16 dB.

DETAILED DESCRIPTION

Described herein are techniques for a bi-directional coupler system. In the following description, for purposes of explanation, numerous examples and specific details are set forth in order to provide a thorough understanding of some embodiments. Some embodiments as defined by the claims may include some or all of the features in these examples alone or in combination with other features described below, and may further include modifications and equivalents of the features and concepts described herein.

Some embodiments include a first switch that is controlled to terminate a first port of a bi-directional coupler when a first test point is not connected to the first port. Also, some embodiments include a second switch that is controlled to terminate a second port of the bi-directional coupler when a second test point is not connected to the second port. The bi-directional coupler may couple an upstream signal in an upstream direction and a downstream signal in a downstream direction. The first switch is used at an upstream port and the second switch is used at a downstream port. The switches may toggle between a termination load and a test point. When the test point is inserted in a test point connector, the first switch connects the test point to the bi-directional coupler. However, when an upstream test point is not inserted in an upstream test point connector, the first switch switches to connect a first termination load to the upstream port. Also, when a downstream test point is not inserted in a downstream test point connector, the second switch switches to connect a second termination load to the downstream port.

The use of the switch and the termination loads improve the coupler directivity because there is not an open test point connection at one of the upstream port or downstream port when one of the upstream test point or the downstream test point is not inserted in a test point connector. For example, all ports of the bi-directional coupler are properly terminated at all times and the bi-directional coupler may have the maximum directivity afforded by the design of the bi-directional coupler.

System Overview

Figure 1:
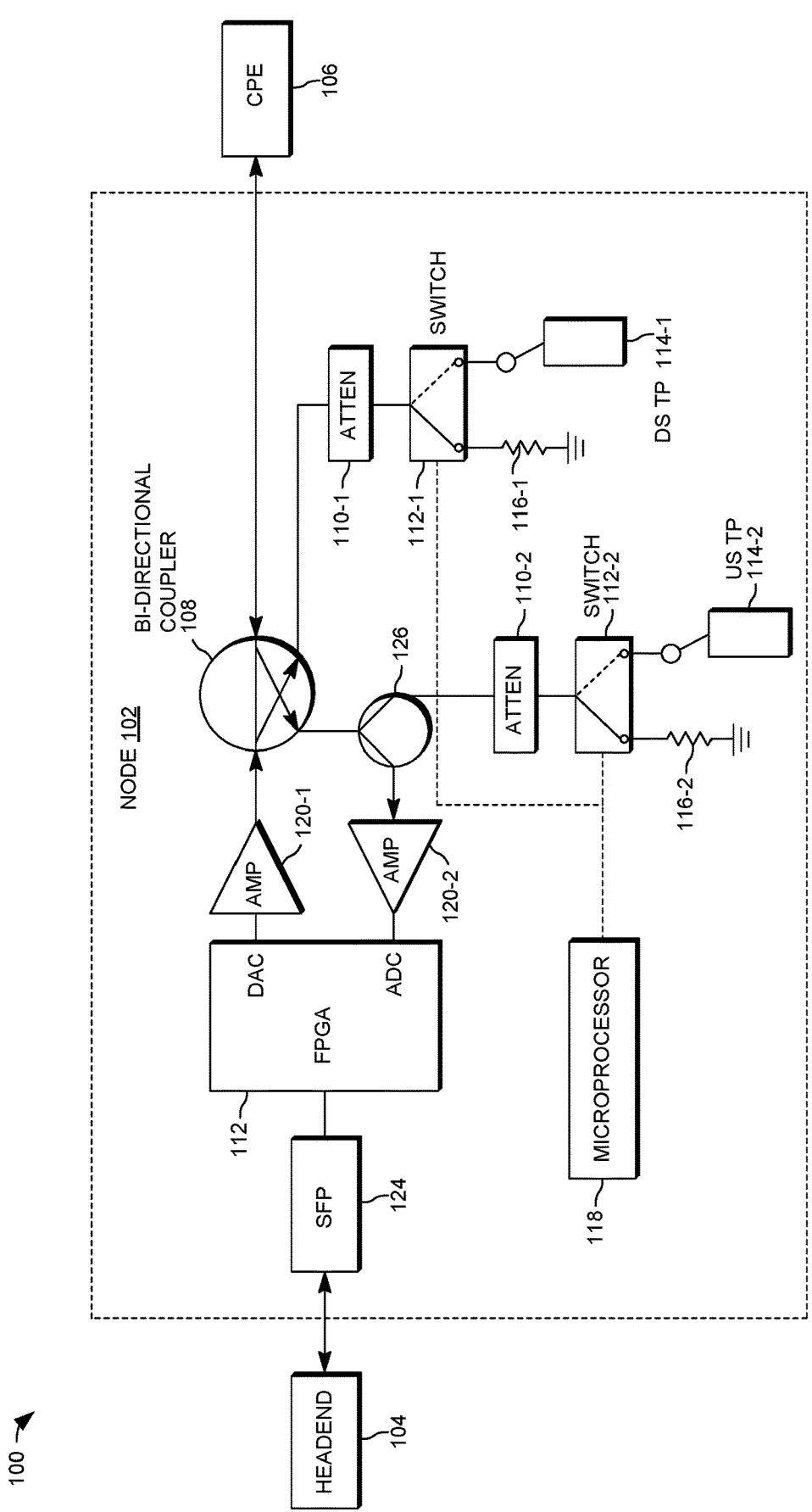
FIG. 1 depicts a simplified system that terminates ports in a bi-directional coupler according to some embodiments.

FIG. 1 depicts a simplified system 100 that terminates ports in a bi-directional coupler according to some embodiments. System 100 includes a node 102, a head end 104, and customer premise equipment (CPE) 106. In some embodiments, node 102 is separate from headend 104. However, components of node 102 may also be included in head end 104. In some cases, an operator would like to have a test point inserted in both directions so that the operators can check system level performance without interrupting the operation of a live network. Although the following network is described, some embodiments may be used in other network configurations, such as WiFi or wireless networks.

In a full duplex design, the downstream connection and the upstream connection may use the same spectrum. A single bi-directional coupler 108 may be used to couple the downstream signal to downstream components for processing and also couple the upstream signal to the upstream components for processing. Using the bi-directional coupler 108 is different from using a separate coupler for the upstream direction and a separate coupler for the downstream direction as described in the Background.

In the downstream direction, head end 104 may send a signal to node 102, such as a digital signal through a digital medium. In some embodiments, the signal may be programming for a cable television system; however, other content may be sent. In other examples, head end 104 may send an analog signal through an analog medium to node 102.

A small-form pluggable transceiver (SFP) 124 may receive the downstream signal. In some embodiments, the transceiver may be a regular SFP digital transceiver or an enhanced SFP transceiver (SFP+) that may have more bandwidth capabilities then the regular SFP transceiver. Also, an analog signal may be received and processed by an analog receiver.

A field programmable logic gate array (FPGA) 112 receives the signal and can convert the downstream signal using a digital-to-analog converter (DAC) from the digital signal to an analog signal. An amplifier 120-1, such as an RF amplifier, amplifies the analog signal and sends the analog signal to bi-directional coupler 108. Bi-directional coupler 108 may then couple the downstream signal to CPE 106, which may be a cable modem or other subscriber device. CPE 106 receives the signal and can output the signal, such as to a subscriber device.

In the upstream direction, CPE 106 may send an upstream signal to node 102. The upstream signal may be an analog signal. Bi-directional coupler 108 may couple the upstream signal through a splitter 126. Splitter 126 splits the signal and sends the signal to an amplifier, such as an RF amplifier 120-2. After amplifying the analog signal, FPGA 122 may use an analog-to-digital converter (ADC) to convert the analog signal to a digital signal. The digital signal is sent through SFP 124 to head end 104. In other examples, node 102 may send an analog signal.

In some embodiments, test points may be inserted into an upstream connection or a downstream connection in node 102. For example, node 102 may have a test point connector (e.g., slot or other connection device) in which test points can be inserted. When the term inserted is used, the insertion may be any type of connection that can be made with a test point 114. For example, test point 114 may be inserted in a slot, connected to a connection pad, etc. When inserted, test point 114 may be connected to a board, such as an integrated circuit board, in which test point 114 is now operational and powered on.

When inserted, the test points may be used to test the connection. An upstream test point (US TP) 114-2 may be used to test the connection (e.g., bandwidth or other performance metrics) in the upstream direction, which is from CPE 106 to head end 104 through node 102. A downstream test point (DS TP) 114-1 may be used to test the connection of a downstream connection from head end 104 to CPE 106 through node 102. Downstream test point 114-1 and upstream test point 114-2 may or may not be inserted into a test point connector. That is, both downstream test point 114-1 and upstream test point 114-2 may be connected, both downstream test point 114-1 and upstream test point 114-2 may not be connected, downstream test point 114-1 may be connected, but upstream test point 114-2 may not be connected, and upstream test point 114-1 may be connected, but downstream test point 114-1 may not be connected.

When downstream test point 114-1 is inserted into a downstream test point connector of bi-directional coupler 108, bi-directional coupler 108 may couple to the downstream signal to downstream test point 114-1 at a downstream test point port. For example, bi-directional coupler 108 may couple the downstream signal through attenuator 110-1, a switch 112-1 (e.g., an RF switch) to downstream test point 114-1. Although attenuation of the signal may be performed, attenuation may not be needed.

When downstream test point 114-1 is not inserted in a test point connector, a termination load 116-1 is connected to bi-directional coupler 108 at the downstream test point port. For example, the downstream test point port is connected through attenuator 110-1, switch 112-1 to termination load 116-1, which may be a 75-ohm load. The 75-ohm load may match the load of upstream test point 114-2 or termination load 116-2. The matching of the loads provides maximum directivity for bi-directional coupler 108.

When an upstream test point 114-2 is inserted into an upstream test point connector of bi-directional coupler 108, the upstream signal is sent from the upstream test point port of bi-directional coupler 108 through splitter 126. Splitter 126 splits the signal and sends the signal to attenuator 110-2 and switch 112-2 to upstream test point 114-2.

When upstream test point 114-2 is not connected to a test point connector, switch 112-2 switches to connect termination load 116-2 to the upstream test point port. For example, the upstream test point port is connected through attenuator 110-2, switch 112-2 to termination load 116-2, which may be a 75-ohm load. The 75-ohm load may match the load of downstream test point 114-1 or termination load 116-1. The matching of the loads also provides maximum directivity for bi-directional coupler 108.

A microprocessor 118 may control switch 112-2 to couple the upstream test point port to upstream test point 114-2 or termination load 116-2. Also, microprocessor 118 may control switch 112-1 to couple downstream test point 114-1 and termination load 116-1 to the downstream test point port. Microprocessor 118 may analyze whether or not downstream test point 114-1 or upstream test point 114-2 is inserted in a respective test point connector to determine the position of switch 112-1 and 112-2, respectively.

Bi-Directional Coupler

Figure 2:
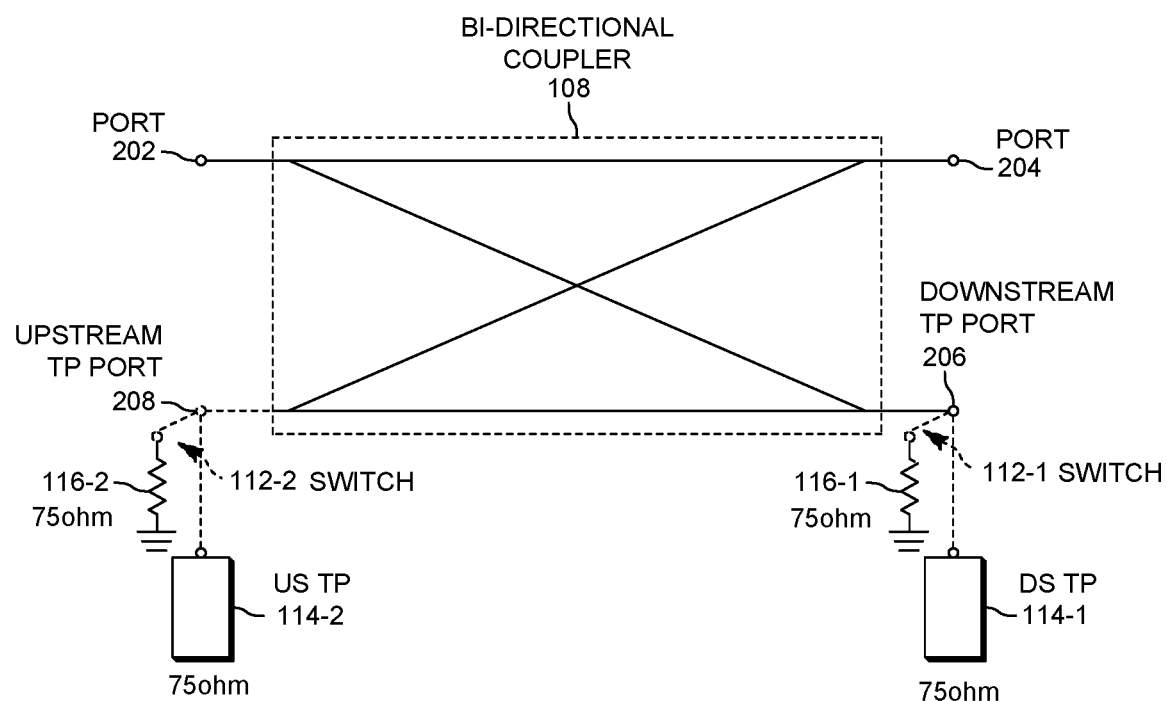
FIG. 2 depicts a more detailed example of a bi-directional coupler according to some embodiments.

FIG. 2 depicts a more detailed example of bi-directional coupler 108 according to some embodiments. Bi-directional coupler 108 includes a first port 202, a second port 204, a downstream test point (TP) port 206 and an upstream test point (TP) port 208. First port 202 and second port 204 may be both used for the upstream signal and the downstream signal. For example, when bi-directional coupler 108 is coupling the downstream signal downstream, first port 202 is an input downstream port that receives the downstream signal and second port 204 is an output downstream port that outputs the downstream signal. When bi-directional coupler 108 is coupling the upstream signal upstream, second port 204 is an input upstream port that receives the upstream signal and first port 202 is an output upstream port that outputs the upstream signal.

Switch 112-2 can switch between termination load 116-2 and upstream test point 114-2. As shown, both upstream test point 114-2 and termination load 116-2 may have a 75-ohm load. Although a 75-ohm load is used, the load may be different values. For example, load impedance is 75 ohm for a 75 ohm system (e.g., cable television networks) and 50 ohm for a 50 ohm system (e.g., a WiFi or a wireless system). However, termination load 116-2 may have the same load (or very similar within a threshold) as downstream test point 114-1 to provide the maximum isolation and maximum directivity when upstream test point 114-2 is not connected to upstream test point port 208.

Switch 112-1 may also switch between termination load 116-1 and downstream test point 114-1. Similarly, termination load 116-1 and downstream test point 114-1 have the same load of 75-ohms. Termination load 116-1 may have the same load (or very similar within a threshold) as upstream test point 114-2 to provide the maximum isolation and directivity when test point 114-1 is not connected to downstream test point port 206.

Figure 3A:
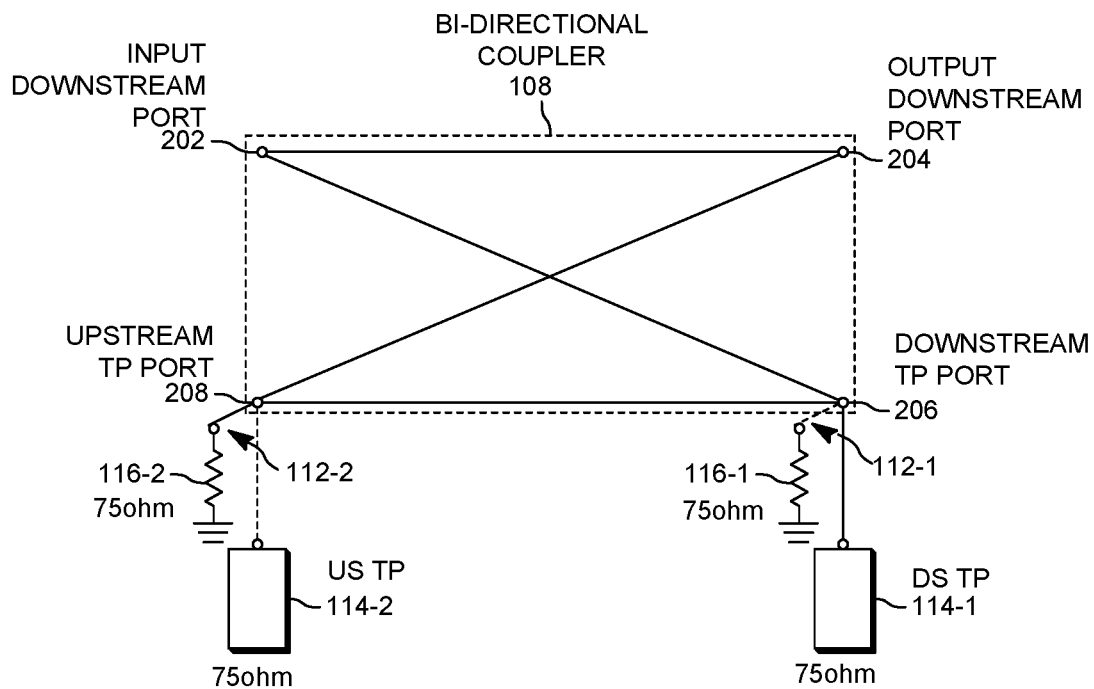
FIG. 3A shows the downstream connection without an upstream test point connected to the bi-directional coupler according to some embodiments.
Figure 3B:
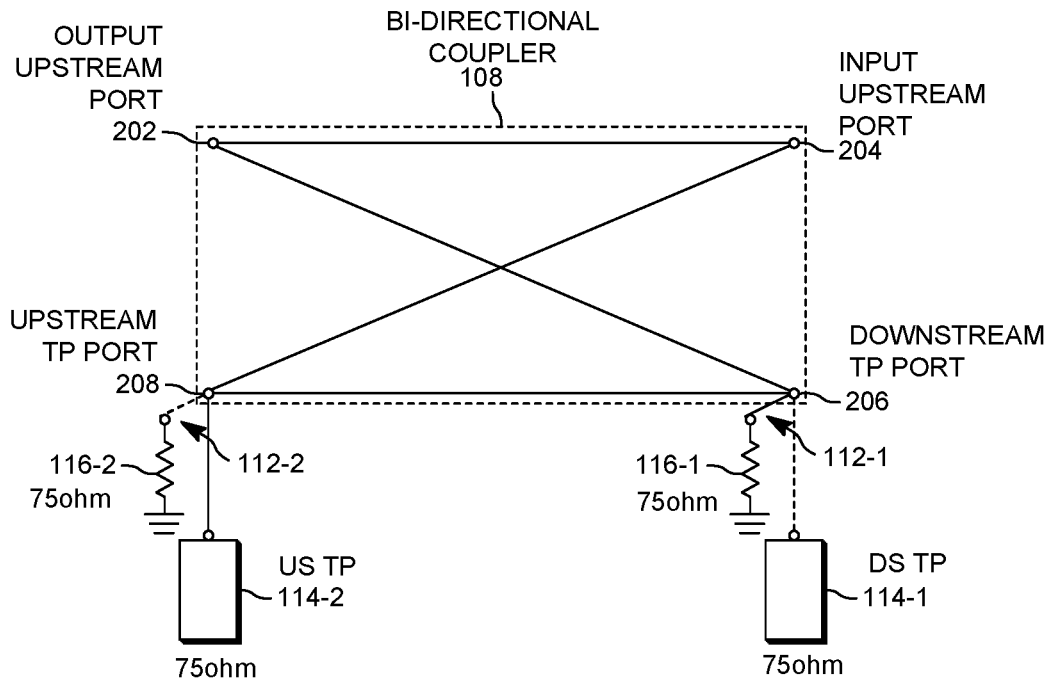
FIG. 3B shows the upstream connection without a downstream test point connected to a bi-directional coupler according to some embodiments.
Figure 3C:
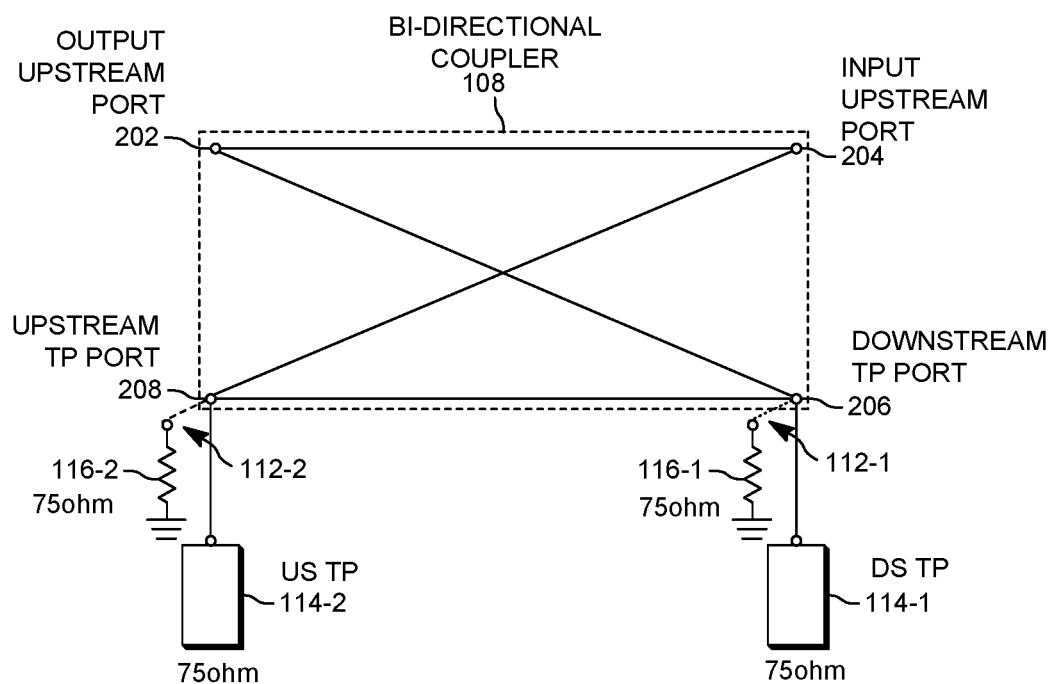
FIG. 3C shows a connection with both the downstream test point and the upstream test point connected to the bi-directional coupler according to some embodiments.

As discussed above, different combinations of which test points are inserted into test point connections may be appreciated. FIGS. 3A, 3B, and 3C show different connections for bi-directional coupler 108 according to some embodiments. FIG. 3A shows the downstream connection without upstream test point 114-2 connected to bi-directional coupler 108 according to some embodiments. Downstream test point 114-1 has been inserted into a test point connector and is connected to bi-directional coupler 108.

Input downstream port 202 receives a downstream signal and the downstream signal is coupled to output downstream port 204. Also, the downstream signal is coupled to downstream test point port 206 because switch 112-1 is switched to downstream test point 114-1. Accordingly, termination load 116-1 is not connected to bi-directional coupler 108.

Upstream test point port 208 is also coupled to output downstream port 204. This port needs to be properly terminated to provide maximum isolation in the downstream direction. In this example, upstream test point 114-2 is not inserted in a test point connector. Accordingly, switch 112-2 is switched to couple termination load 116-2 to upstream test point port 208 thereby terminating upstream test point port 208 and not leaving an open port. Termination load 116-2 is the same load as downstream test point 114-1 to provide maximum directivity.

FIG. 3B shows the upstream connection without downstream test point 114-1 connected to bi-directional coupler 108 according to some embodiments. Input upstream port 204 receives an upstream signal and couples the upstream signal to output upstream port 202. Also, input upstream port 204 couples the upstream signal to upstream test point port 208. Upstream test point 114-2 has been inserted into a test point connector and is connected to bi-directional coupler 108 via switch 112-2. Accordingly, termination load 116-2 is not connected to bi-directional coupler 108.

Also, output upstream port 202 is coupled to downstream test point port 206. This port needs to be properly terminated to provide maximum isolation in the upstream direction. In this example, downstream test point 114-1 is not inserted in a test point connector. Accordingly, switch 112-1 is switched to couple termination load 116-1 to downstream test point port 206 thereby terminating downstream test point port 206. Termination load 116-1 is the same load as upstream test point 114-2 to provide maximum directivity.

FIG. 3C shows a connection with both downstream test point 114-1 and upstream test point 114-2 connected to bi-directional coupler 108 according to some embodiments. Since both downstream test point 114-1 and upstream test point 114-2 are inserted into a respective test point connector, termination loads are not needed. Switch 112-1 connects downstream test point 114-1 to downstream test point port 206 and switch 112-2 connects upstream test point 114-2 to upstream test point port 208. Both test points 114-1 and 114-2 are the same load and provide maximum directivity for bi-directional coupler 108.

In some embodiments, both downstream test point 114-1 and upstream test point 114-2 may not be inserted into test point connectors. In this example, switch 112-1 is connected to termination load 116-1 and switch 112-2 is connected to termination load 116-2.

Different Examples of Detection Mechanisms

Figure 4A:
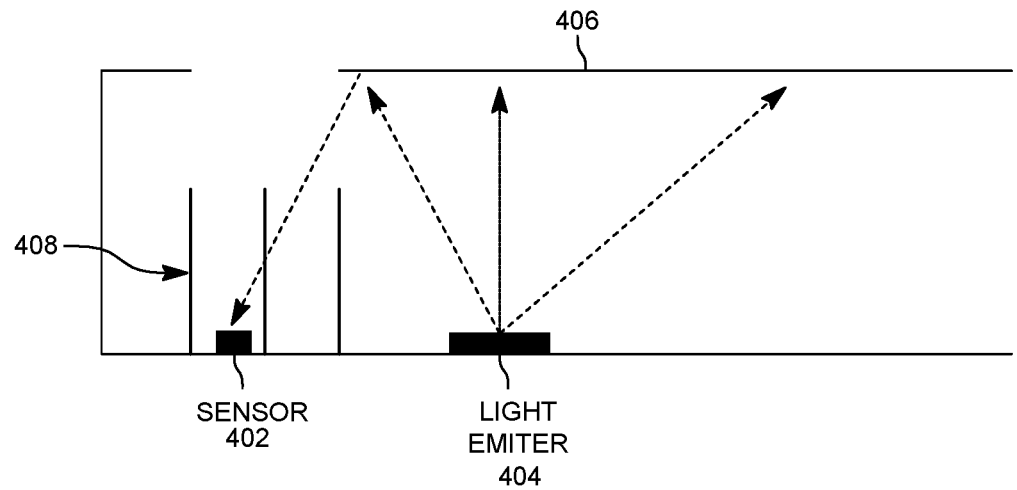
FIGS. 4A and 4B show a sensor being used to detect when a test point is inserted into a test point connector according to some embodiments.
Figure 4B:
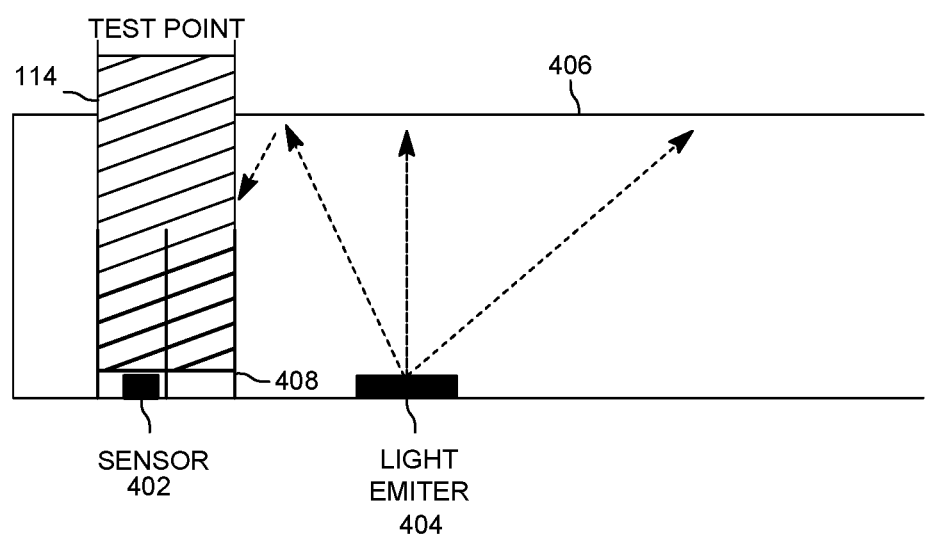

The following describes some examples of detection mechanisms. Although these examples of detection mechanisms are described, other examples of detection mechanisms may be used. FIGS. 4A and 4B show a sensor 402 being used to detect when a test point is inserted into a test point connector 408 according to some embodiments. In FIG. 4A, sensor 402, such as a light sensor, can detect a signal, such as light. Sensor 402 may be located in test point connector 408 in which a test point 114 may be inserted. For example, sensor 402 may be on a circuit board in which test point 114 may be inserted to connect to test point connector 408.

Node 102 includes an emitter, such as light emitter 404, that emits the signal, such as light, which may be detected by sensor 402. For example, light may reflect off a surface 406 in node 102 to sensor 402. However, in other examples, the light may not need to be reflected off a surface. Rather, the light may be emitted directly to sensor 402.

FIG. 4B shows an example when a test point 114 is inserted into test point connector 408 according to some embodiments. When test point 114 is inserted into test point connector 408, test point 114 becomes operational as in test point 114 can test network characteristics for node 102. However, test point 114 needs to be coupled to a port of bi-directional coupler 108. When the light emitted by emitter 404 is blocked from reaching light sensor 402, light sensor 402 may output a signal indicating that test point 114 has been inserted in test point connector 408. In some embodiments, the light may be blocked test point 114 thereby blocking the light from reaching light emitter 404. Microprocessor 118 uses the signal from light sensor 402 to change a position of switches 112-1 and/or 112-2 to couple a test point 114 to upstream test point port 208 and/or downstream test point port 206 as described above.

Figure 5A:
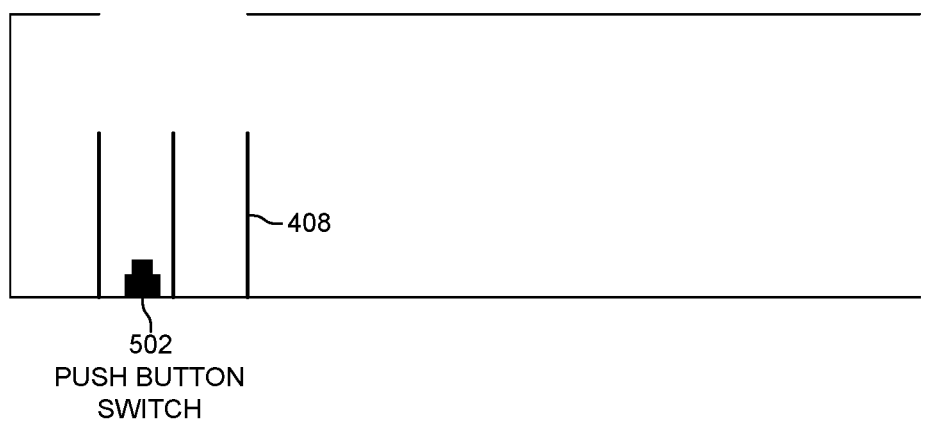
FIGS. 5A and 5B depict an example of a push-button switch according to some embodiments.
Figure 5B:
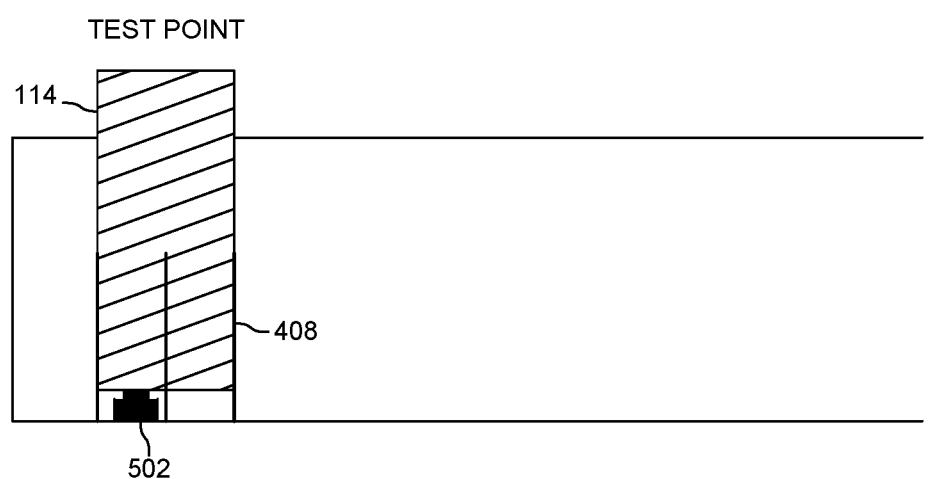

FIGS. 5A and 5B depict an example of a push-button switch according to some embodiments. In FIG. 5A, push-button switch 502 may be a structure that can be actuated by contact. For example, the push-button switch may be pushed in a direction, such as downward or parallel to the insertion direction of test point 114. Push-button switch 502 may be located at the bottom of test point connector 408. However, push-button switch 502 may also be located at other locations, such as the side of test point connector 408. Also, push-button switch 502 may be actuated in any direction, such as parallel to a circuit board or perpendicularly to test point 114.

In FIG. 5B, when test point 114 is inserted into test point connector 408, push-button switch 502 is actuated in a downward direction. When push-button switch 502 is actuated, such as past a threshold, then push-button switch 502 outputs a signal indicating test point 114 has been inserted into test point connector 408. The signal from push-button switch 502 may be used to change switches 112-1 and/or 112-2 to couple test point 114 to upstream test point port 208 and/or downstream test point port 206 as described above.

Figure 6A:
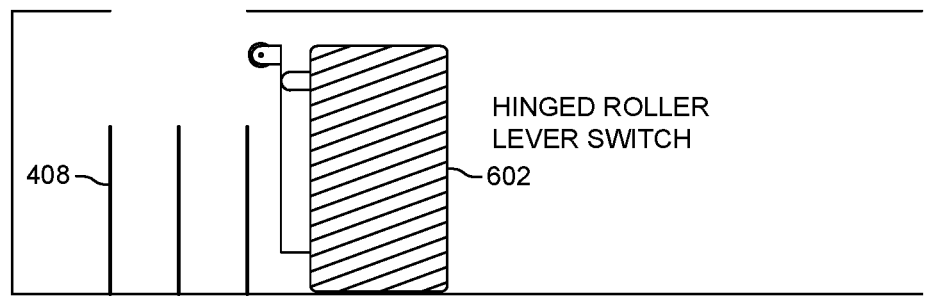
FIGS. 6A and 6B depict an example of a hinge roller lever switch according to some embodiments.
Figure 6B:
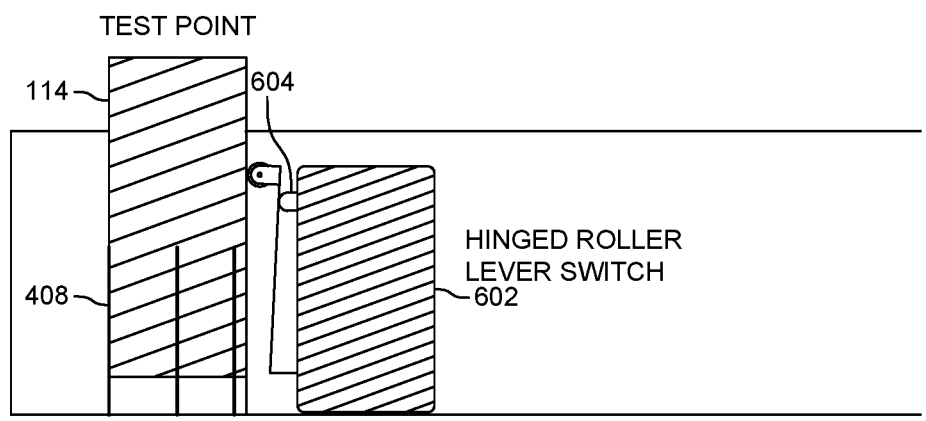

FIGS. 6A and 6B depict an example of a hinge roller lever switch according to some embodiments. In FIG. 6A, hinge folder lever switch 602 may include a lever that can be actuated in a direction. Hinge folder lever switch 602 may be located on a side of test point connector 408. A lever with a roller is placed proximate to test point connector 408 such that a test point 114 will contact the roller when inserted in test point connector 408.

In FIG. 6B, test point 114 has been inserted into test point connector 408. At 604, the lever of hinge folder lever switch has been moved in a direction that depresses a button. When inserted, test point 114 moves the roller lever in a direction to actuate a button, such as to depress a button on hinge roller lever switch 602. When the button is depressed, hinge roller lever switch 602 outputs a signal indicating test point 114 has been inserted into test point connector 408. The signal from hinge folder lever switch 602 may be used to change switches 112-1 and/or 112-2 to couple test point 114 to upstream test point port 208 and/or downstream test point port 206 as described above.

Switch Control

Figure 7:
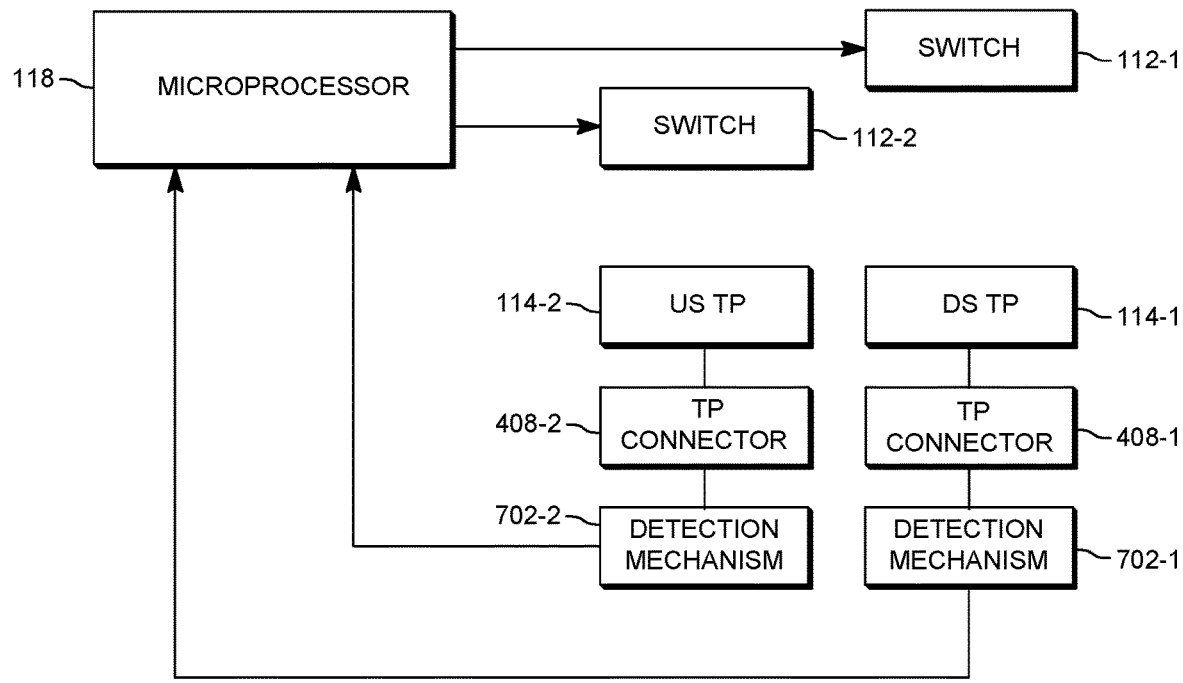
FIG. 7 depicts the signaling to control switches according to some embodiments.

As discussed above, each implementation sent a signal that caused a switch to couple test point 114 to bi-directional coupler 108. FIG. 7 depicts the signaling to control switches 112 according to some embodiments. Node 102 includes a detection mechanism 702-1 that detects whether downstream test point 114-1 is inserted into test point connector 408 and a detection mechanism 702-2 that detects whether upstream test point 114-2 is inserted into test point connector 408. Detection mechanism 702-1 or 702-2 may be one of the detection mechanisms described above or may be a different one. When either detection mechanism 702-1 or 702-2 detects the insertion of a test point 114-1 or 114-2, respectively, detection mechanism 702-1 or 702-2 sends a signal to microprocessor 118.

Microprocessor 118 processes the signal and determines that a test point has been inserted into a respective test point connector 408. Once the test point is inserted into the test point connector 408, microprocessor 118 communicates with switch 112-1 or switch 112-2. For example, when downstream test point 114-1 is inserted into a test point connector 408-1, microprocessor 118 sends a signal to switch 112-1 to couple downstream test point port 206 to downstream test point 114-1. Similarly, when microprocessor 118 detects that test point 114-2 is inserted into a test point connector 408-2, microprocessor 118 sends a signal to switch 112-2 to couple test point connector 114-2 to upstream test point port 208.

Figure 8:
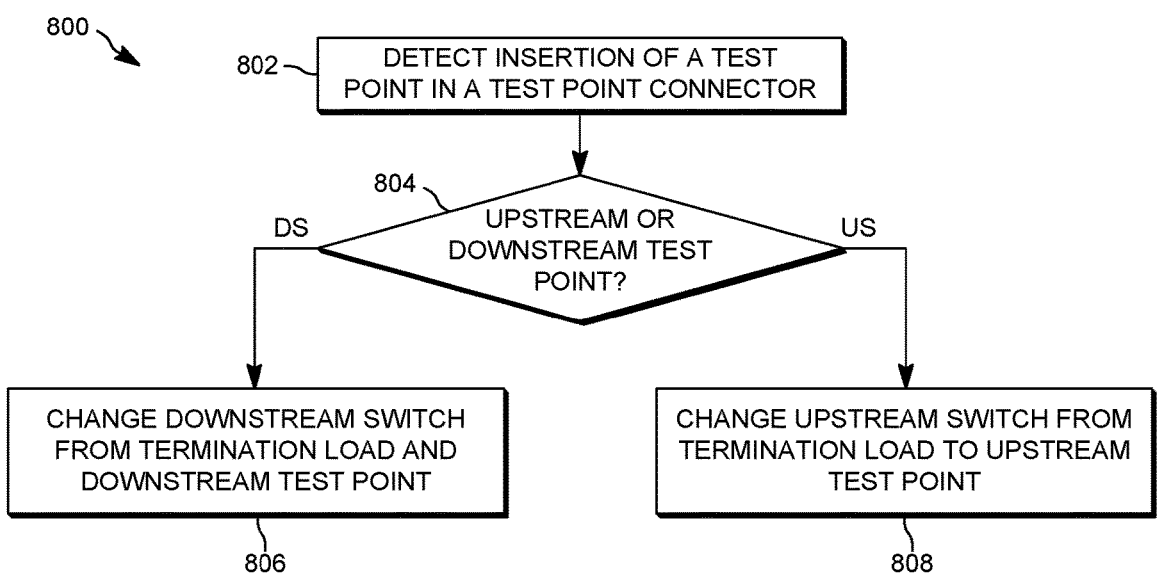
FIG. 8 depicts a simplified flowchart of a method for controlling switches according to some embodiments.

FIG. 8 depicts a simplified flowchart 800 of a method for controlling switches according to some embodiments. At 802, microprocessor 118 detects an insertion of a test point 114 in test point connector 408. At 804, microprocessor 118 determines which test point 114 has been inserted. For example, microprocessor 118 may determine whether an upstream test point 114-2 or a downstream test point 114-1 has been inserted. At 806, when a downstream test point 114-1 has been inserted, microprocessor 118 changes switch 112-1 from termination load 116-1 to downstream test point 114-1.

At 808, when an upstream test point 114-2 has been inserted, microprocessor 118 changes switch 112-2 from termination load 116-2 to upstream test point 114-2. Accordingly, instead of having an open port when a test point is not inserted in a test point connector, some embodiments couple a termination load to provide better isolation for bi-directional coupler 108.

System

Figure 9:
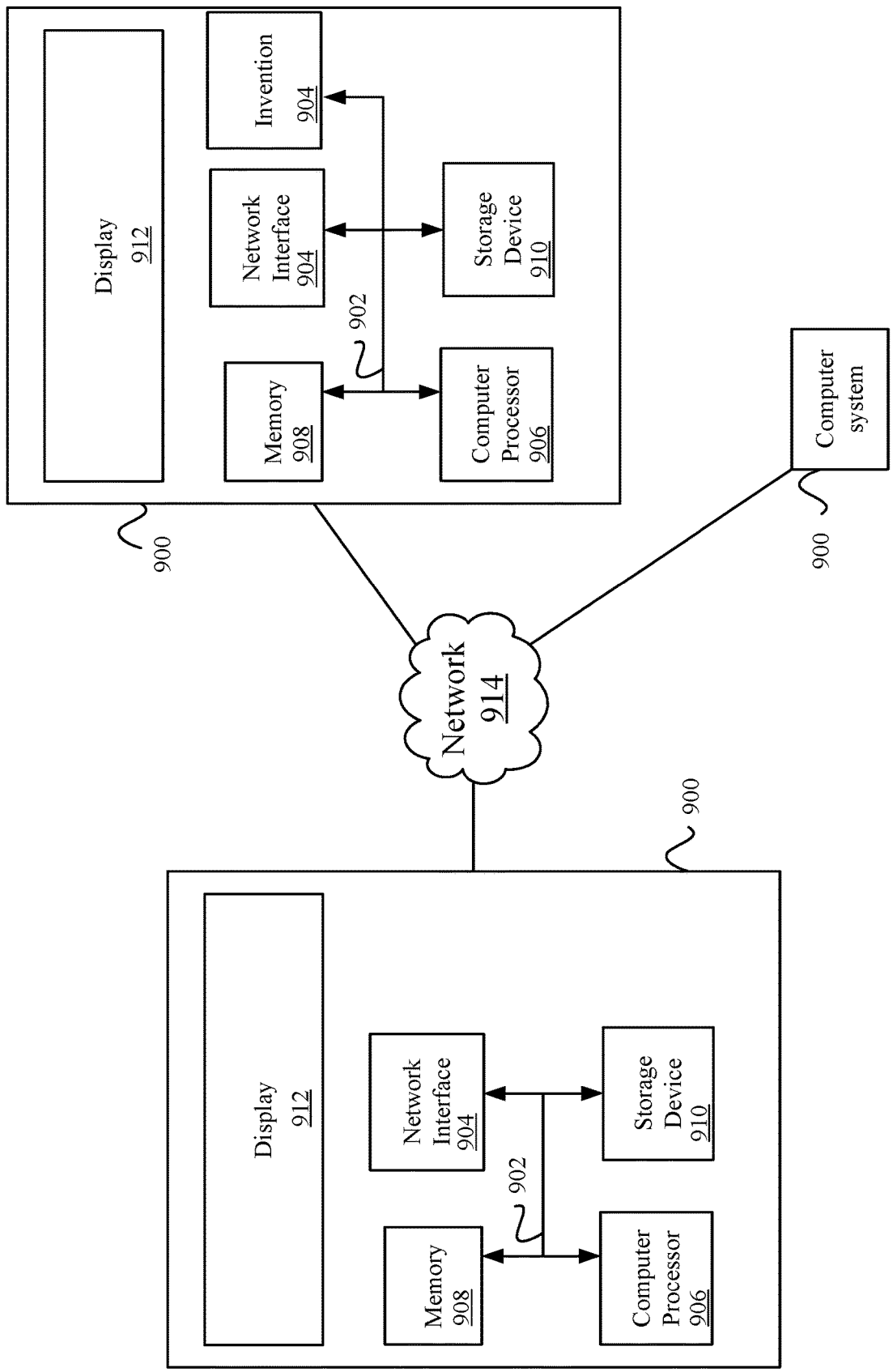
FIG. 9 illustrates an example of special purpose computer systems configured with the node according to one embodiment.

FIG. 9 illustrates an example of special purpose computer systems 900 configured with node 102 according to one embodiment. Computer system 900 includes a bus 902, network interface 904, a computer processor 906, a memory 908, a storage device 910, and a display 912.

Bus 902 may be a communication mechanism for communicating information. Computer processor 906 may execute computer programs stored in memory 908 or storage device 908. Any suitable programming language can be used to implement the routines of some embodiments including C, C++, Java, assembly language, etc. Different programming techniques can be employed such as procedural or object oriented. The routines can execute on a single computer system 900 or multiple computer systems 900. Further, multiple computer processors 906 may be used.

Memory 908 may store instructions, such as source code or binary code, for performing the techniques described above. Memory 908 may also be used for storing variables or other intermediate information during execution of instructions to be executed by processor 906. Examples of memory 908 include random access memory (RAM), read only memory (ROM), or both.

Storage device 910 may also store instructions, such as source code or binary code, for performing the techniques described above. Storage device 910 may additionally store data used and manipulated by computer processor 906. For example, storage device 910 may be a database that is accessed by computer system 900. Other examples of storage device 910 include random access memory (RAM), read only memory (ROM), a hard drive, a magnetic disk, an optical disk, a CD-ROM, a DVD, a flash memory, a USB memory card, or any other medium from which a computer can read.

Memory 908 or storage device 910 may be an example of a non-transitory computer-readable storage medium for use by or in connection with computer system 900. The non-transitory computer-readable storage medium contains instructions for controlling a computer system 900 to be configured to perform functions described by some embodiments. The instructions, when executed by one or more computer processors 906, may be configured to perform that which is described in some embodiments.

Computer system 900 includes a display 912 for displaying information to a computer user. Display 912 may display a user interface used by a user to interact with computer system 900.

Computer system 900 also includes a network interface 904 to provide data communication connection over a network, such as a local area network (LAN) or wide area network (WAN). Wireless networks may also be used. In any such implementation, network interface 904 sends and receives electrical, electromagnetic, or optical signals that carry digital data streams representing various types of information.

Computer system 900 can send and receive information through network interface 904 across a network 914, which may be an Intranet or the Internet. Computer system 900 may interact with other computer systems 900 through network 914. In some examples, client-server communications occur through network 914. Also, implementations of some embodiments may be distributed across computer systems 900 through network 914.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. An apparatus comprising:
   a bi-directional coupler for coupling an upstream signal and a downstream signal;
   a termination load;
   a test point detection mechanism configured to detect when a test point device is inserted in a test point connector, wherein the test point device is configured to perform a test of the upstream signal or the downstream signal; and
   a switch configured to switch from being coupled to the termination load to being coupled to the test point device when the test point device is detected as being inserted in the test point connector, wherein the switch is configured to switch from being coupled to the test point device to being coupled to the termination load when the test point device is detected as being removed from being inserted in the test point connector.

2. The apparatus of claim 1, wherein the test point device comprises a first test point device, the test point detection mechanism comprises a first test point detection mechanism, the termination load comprises a first termination load, the test point connector comprises a first test point connector, and the switch comprises a second switch, the apparatus comprising:
   a second termination load;
   a second test point detection mechanism configured to detect when a second test point device is inserted in a second test point connector, wherein the second test point device is configured to perform a second test of the upstream signal or the downstream signal; and
   a second switch configured to switch from being coupled to the second termination load to being coupled to the second test point device when the second test point device is detected as being inserted in the second test point connector, wherein the second switch is configured to switch from being coupled to the second test point device to being coupled to the second termination load when the second test point device is detected as being removed from being inserted in the second test point connector.

3. The apparatus of claim 2, wherein the bi-directional coupler comprises:
   a first port configured to receive the upstream signal or the downstream signal;
   a second port configured to send the upstream signal or the downstream signal to a network device;
   a third port coupled to the first switch and the first port; and
   a fourth port coupled to the second switch and the second port.

4. The apparatus of claim 1, wherein the test point detection mechanism comprises:
   a push button configured to detect the insertion of the test point device in the test point connector using actuation of the push button.

5. The apparatus of claim 4, wherein the push button detects the insertion of the test point device in the test point connector when the test point device actuates the push button in a first direction.

6. The apparatus of claim 5, wherein the push button detects a removal of the test point device from the test point connector when the push button is actuated in a second direction.

7. The apparatus of claim 1, wherein the test point detection mechanism comprises:
   a light sensor configured to detect the insertion of the test point device in the test point connector using a light.

8. The apparatus of claim 7, wherein the light sensor detects a change in the light being sensed to detect the insertion of the test point device.

9. The apparatus of claim 8, wherein the insertion of the test point device in the test point connector blocks the light from being sensed by the light sensor.

10. The apparatus of claim 7, wherein the light sensor detects a removal of the test point device from the test point connector when the light is detected from a state of not being detected.

11. The apparatus of claim 7, further comprising:
    an emitter configured to generate the light detected by the light sensor.

12. The apparatus of claim 1, wherein the test point detection mechanism comprises:
    a lever device configured to detect the insertion of the test point device in the test point connector using an actuation of a lever.

13. The apparatus of claim 12, wherein the lever device detects the insertion of the test point device in the test point connector when the lever is actuated in a first direction.

14. The apparatus of claim 13, wherein the lever device detects a removal of the test point device from the test point connector when the lever is actuated in a second direction.

15. A method comprising:
    configuring a switch to couple a termination load to a bi-directional coupler, the bi-directional coupler configured to couple an upstream signal in an upstream direction and a downstream signal in the downstream direction;
    detecting a test point device being inserted in a test point connector; and
    configuring the switch to switch from being coupled to the termination load to being coupled to the test point device when the test point device is detected as being inserted in the test point connector, wherein the switch is configured to switch from being coupled to the test point device to being coupled to the termination load when the test point device is detected as being removed from being inserted in the test point connector.

16. The method of claim 15, wherein the test point device comprises a first test point device, the test point detection mechanism comprises a first test point detection mechanism, the termination load comprises a first termination load, the test point connector comprises a first test point connector, and the switch comprises a second switch, the method further comprising:
configuring a second switch to couple a second termination load to the bi-directional coupler;
detecting a second test point device being inserted in a second test point connector; and
configuring the second switch to switch from being coupled to the second termination load to being coupled to the second test point device when the second test point device is detected as being inserted in the second test point connector, wherein the second switch is configured to switch from being coupled to the second test point device to being coupled to the second termination load when the second test point device is detected as being removed from being inserted in the second test point connector.

17. The method of claim 16, wherein detecting the test point device comprises:
detecting the insertion of the test point device in the test point connector using actuation of a push button in a first direction.

18. The method of claim 15, wherein detecting the test point device comprises:
detecting the insertion of the test point device in the test point connector using a light sensor that sensing a light not being detected.

19. The method of claim 15, wherein detecting the test point device comprises:
detecting the insertion of the test point device in the test point connector using an actuation of a lever.

20. A non-transitory computer-readable storage medium containing instructions, that when executed, control a computer system to be configured for:
configuring a switch to couple a termination load to a bi-directional coupler, the bi-directional coupler configured to couple an upstream signal and a downstream signal;
detecting a test point device being inserted in a test point connector; and
configuring the switch to switch from being coupled to the termination load to being coupled to the test point device when the test point device is detected as being inserted in the test point connector, wherein the switch is configured to switch from being coupled to the test point device to being coupled to the termination load when the test point device is detected as being removed from being inserted in the test point connector.

* * * * *